United States Patent
Noguchi et al.

(10) Patent No.: US 7,230,818 B2
(45) Date of Patent: Jun. 12, 2007

(54) PRINTED CIRCUIT BOARD AND MANUFACTURING METHOD THEREOF

(75) Inventors: Setsuo Noguchi, Yokohama (JP);
Kohtaroh Takahashi, Yokohama (JP);
Eiji Matsunaga, Yokohama (JP);
Yoshihiko Saiki, Sendai (JP); Satoshi Arai, Sendai (JP); Sadamu Toita, Sendai (JP)

(73) Assignees: NEC Tokin Corporation, Miyagi (JP);
Airex Inc., Yokohama, Kanagawa (JP)

( * ) Notice: Subject to any disclaimer, the term of this patent is extended or adjusted under 35 U.S.C. 154(b) by 0 days.

(21) Appl. No.: 11/086,596

(22) Filed: Mar. 22, 2005

(65) Prior Publication Data

US 2005/0217893 A1    Oct. 6, 2005

(30) Foreign Application Priority Data

Mar. 30, 2004    (JP)    ............................. 2004-098063

(51) Int. Cl.
*H01G 9/04* (2006.01)
*H01G 9/145* (2006.01)

(52) U.S. Cl. .................. 361/528; 361/532; 361/763

(58) Field of Classification Search ........ 361/528–529, 361/532, 533–534, 540
See application file for complete search history.

(56) References Cited

U.S. PATENT DOCUMENTS 3,895,272 A * 7/1975 Smolko et al. ............. 361/765

6,707,662 B2 * 3/2004 Waffenschmidt et al. ... 361/523

FOREIGN PATENT DOCUMENTS

| EP | 0899992 A3 | 3/1999 |
|---|---|---|
| JP | 06-069663 | 3/1994 |
| JP | 2001168534 A | 6/2001 |
| JP | 2002-100875 | 4/2002 |
| JP | 2002100875 A | 4/2002 |

* cited by examiner

*Primary Examiner*—Eric W. Thomas
(74) *Attorney, Agent, or Firm*—Crowell & Moring

(57) ABSTRACT

A printed circuit board which is thin and incorporates a large-capacitance capacitor function and a manufacturing method thereof. In one embodiment, the printed circuit board manufacturing method includes forming inner layer conductor circuits on a core substrate; forming a recess part on the core substrate; housing, in a recess part, a planar capacitor device that is not resin molded and has electrodes on the surfaces on a shared side; interposing the same between insulator resin and conductor metal foil to heat pressurize the same for forming a multi-layer plate; forming via holes for electrically connecting an outer layer conductor circuit to the electrodes of the capacitor device; forming a conductor layer on them; and forming the outer layer conductor circuits on the surfaces of the multi-layer plate.

9 Claims, 5 Drawing Sheets

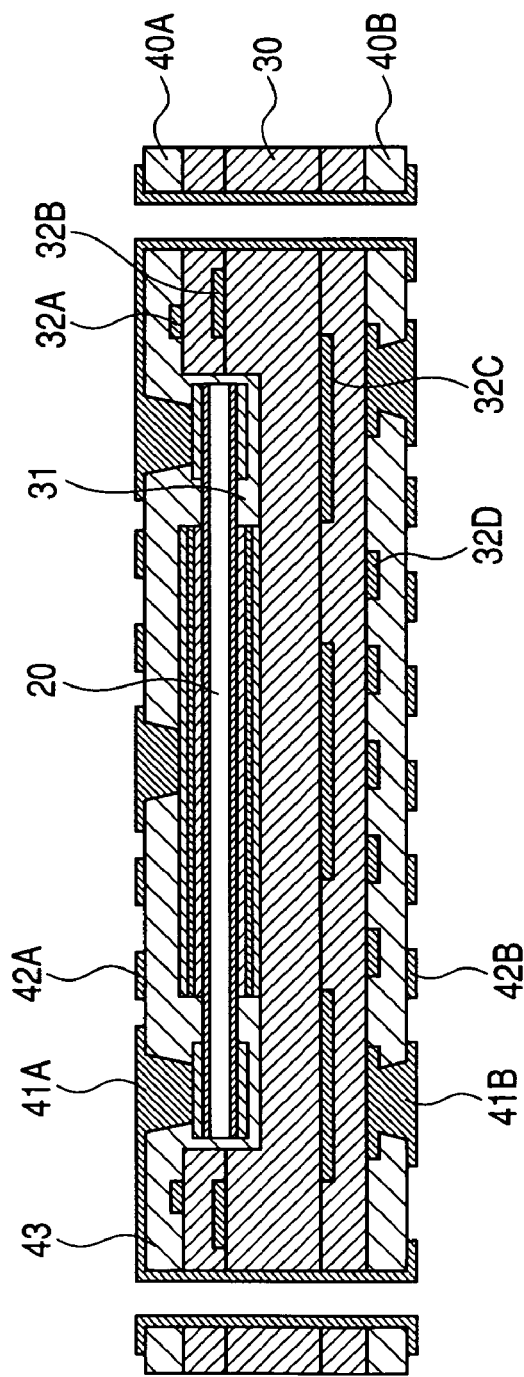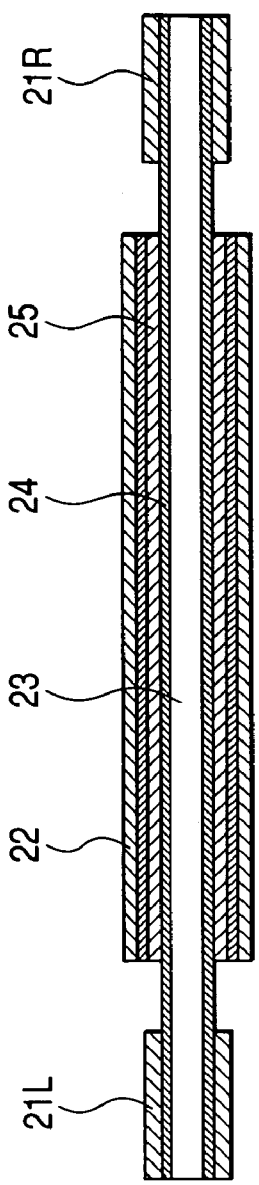

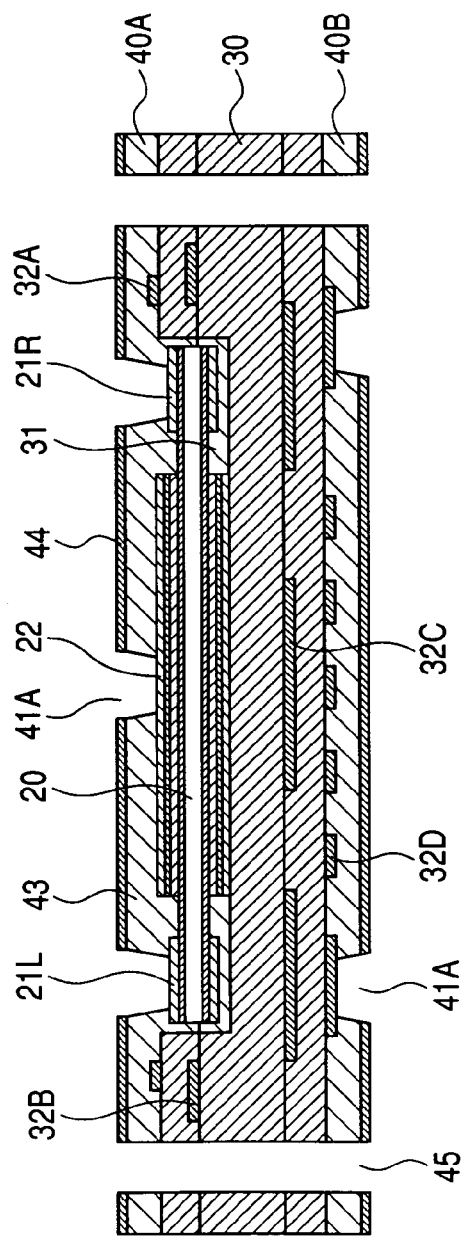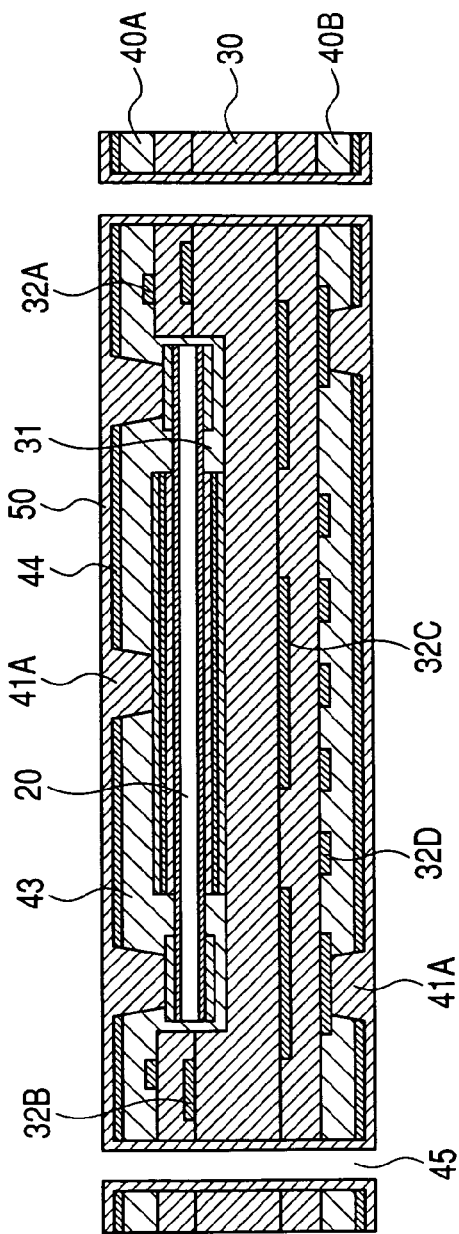

PRINTED CIRCUIT BOARD AND MANUFACTURING METHOD THEREOF

BACKGROUND OF THE INVENTION

1. Field of the Invention

The present invention relates to a printed circuit board and a manufacturing method thereof. More specifically, the present invention relates to a multi-layer printed circuit board incorporating a capacitor function and a manufacturing method thereof.

2. Description of Related Art

With the higher performance of electronic equipment, the number of parts mounted on a printed circuit board is being increased. Due to the miniaturization of electronic equipment, the size of the printed circuit board is required to be further reduced. The area on which the parts can be mounted is being made smaller.

With reduction of the parts in size, the density of surface mounting is becoming higher due to microfabrication of the conductor pattern of the printed circuit board.

The increased number of leads of mounted parts, smaller pitch, increased wiring resistance with a higher multi-layer printed circuit board due to a growing number of mounted parts and finer lines, signal delay due to cross talk noise, heat generation, and malfunction of the equipment with these become problems.

To solve these problems, the wiring length of parts need to be reduced. Specifically, there are proposed a method of burying the parts into a printed circuit board as well as of mounting the parts on the surface of the printed circuit board, and a method of incorporating a function equal to that of the parts into a printed circuit board using a high dielectric sheet material having a high dielectric constant and a paste material. Such techniques disclosed in Japanese Published Unexamined Patent Application Nos. 2002-100875 and Hei 6(1994)-69663 are known.

According to the above related art, the formation of a recess part on the printed circuit board to incorporate a smaller chip part therein to is proposed. At present, the printed circuit board is required to be thinner. Although the chip part is being made smaller, its thickness cannot be sufficiently small, obstructing making the printed circuit board thinner.

The smaller chip reduces the capacitance of a capacitor. It is difficult to respond to a request to make the capacitance larger.

SUMMARY OF THE INVENTION

The present invention solves the foregoing problems and provides a printed circuit board which is thin and incorporates a large-capacitance capacitor function and a manufacturing method thereof.

According to the present invention, a capacitor not resin molded is buried into a recess part formed on a core substrate. A large-capacitance capacitor can be incorporated into a thin printed circuit board.

According to the present invention, a printed circuit board manufacturing method includes the steps of: forming inner layer conductor circuits on a core substrate; forming a recess part on the core substrate; housing, in the recess part, a capacitor device not resin molded; forming insulator layers and conductor layers on the core substrate housing the capacitor device to form a multi-layer plate; forming via holes for electrically connecting an outer conductor layer and electrodes of the capacitor device to form a conductor layer thereon; and forming the outer layer conductor circuits on the surfaces of the multi-layer plate.

According to a preferred embodiment, the capacitor device has a planar shape, and anode and cathode electrodes are formed on the surfaces on the shared side.

The size of the recess part is adjusted to be slightly larger than that of the capacitor not resin molded to obtain high part positioning accuracy. The resin for fixing parts do not need to be filled in the recess part, thereby reducing the number of processes.

Preferably, in the printed circuit board, an unmolded and unpackaged capacitor device having a thickness of 300 µm or less is used as a capacitor part to be buried. The unpackaged capacitor device is thinner than the molded chip part. In the case of burying a chip part having the same capacitance, the printed circuit board can be thinner. The printed circuit board having the same thickness can incorporate a large-capacitance capacitor.

Preferably, in the printed circuit board, the capacitor device to be buried in which the electrode portions are subject to copper plating or fixed copper foil having a thickness of 10 to 30 µm and surface roughness is optimized for bonding to the resin is used. The thickness of the electrode portions is 10 to 30 µm. When using a laser for forming via holes for connecting the electrodes to the conductor pattern of an upper layer, the via holes can be formed without damaging the electrodes. The surface roughness of the electrodes is optimized for bonding to the resin. No processes for increasing the bonding to the resin are necessary. The general printed circuit board manufacturing process can be performed from laser beam machining to plating.

Preferably, the electrodes of the buried capacitor device are connected to the conductor pattern of the upper layer by the via holes. When the conductor pattern of the upper layer is an outer layer of the printed circuit board, the surfaces of the via holes filled by electrolytic copper plating or conductive paste are flat. Since their surfaces are flat, no voids are caused in solder used for connection to the parts mounted on the surface of the printed circuit board, enabling high-reliability connection.

According to of the present invention, a capacitor device has a dielectric layer formed on at least one side of a planar metal substrate, an anode electrode formed on the dielectric layer, and a cathode electrode formed via a conductive film on the dielectric layer, wherein the anode electrode and the cathode electrode have a planar structure facing toward the shared side, and resin molding is not given. The capacitor device which is relatively simple in structure and which is preferable for thinning can be easily housed in the recess part of the core substrate to achieve thinning of the multi-layer plate.

According to the present invention, it is possible to obtain a thinner printed circuit board by burying a planar capacitor device not resin molded into a recess part formed on a core substrate.

BRIEF DESCRIPTION OF THE DRAWINGS

FIG. 1 is a cross-sectional view showing the structure of a printed circuit board according to an embodiment of the present invention;

FIG. 2 is a cross-sectional view showing the structure of a capacitor device according to an embodiment;

FIG. 7 is a diagram showing a printed circuit board manufacturing process according to an embodiment;

FIG. 8 is a diagram showing a printed circuit board manufacturing process according to an embodiment;

DESCRIPTION OF THE PREFERRED EMBODIMENTS

Figure 3:
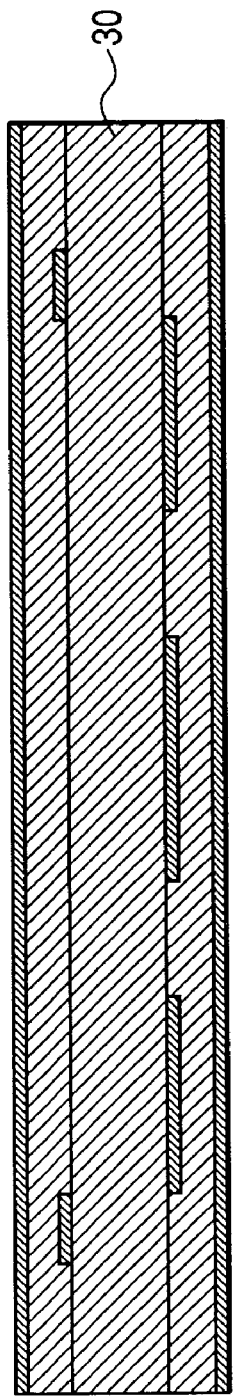
FIG. 3 is a diagram showing a printed circuit board manufacturing process according to an embodiment.

The structure of a printed circuit board according to an embodiment of the present invention will be described below with reference to the drawings. FIG. 1 shows the cross section of a printed circuit board.

A printed circuit board has an unpackaged capacitor device 20, a core substrate 30 housing the capacitor device, and buildup layers 40A and 40B. The core substrate 30 has a recess part 31 housing the unpackaged capacitor device 20 and plural conductor layers 32A, 32B, 32C, and 32D on the surfaces and inside thereof. The buildup layer 40A is formed with via holes 41A and a conductor circuit 42. The conductor circuit 32A on the surface of the core layer, the unpackaged capacitor device 20, and a conductor circuit 42A of the buildup layer are connected by via holes 41A. The buildup layer 40B is formed with via holes 41B and a conductor circuit 42B. The conductor circuit 32D on the surface of the core layer is connected to the conductor circuit 42B of the buildup layer.

According to this embodiment, the buildup layers 40A and 40B are each formed of one layer. They can also be formed of plural buildup layers.

As shown in FIG. 2, the capacitor device 20 is a planar capacitor not resin molded and has anode electrodes (first electrodes) 21L and 21R formed over a metal substrate 23 via a dielectric layer 24 and a cathode electrode (a second electrode) 22 formed over the dielectric layer 24 via a conductive polymer film 25.

The metal substrate 23 is a metal substrate of aluminum, tantalum, and niobium. The dielectric oxide film layer 24 of valve action metal is formed on the surface of the substrate 23. The anode electrodes 21L and 21R, the conductive polymer film 25, and the cathode electrode 22 are formed successively on the oxide film layer 24. The cathode electrode 22 is formed of a graphite layer, a silver paste layer, and a copper metal plate, or of two layers of a graphite layer and a metal plating layer. Alternatively, it may be formed of a metal plating layer without a graphite layer.

The first electrodes 21 and the second electrode 22 are each formed of a copper metal having a thickness of 10 to 30 μm in which surface roughness is optimized for bonding to the resin. Laser beam machining for forming the via holes 41A on the first electrodes 21 and the second electrode 22, as shown in FIG. 1, is easy. Its connectability is higher. The bonding properties to the buildup layer 40A are increased.

The first electrodes 21 and the second electrode 22 are electrodes having a planar structure. As shown in FIG. 1, the via holes 41A can be easily formed to the electrodes 21 and 22.

Figure 10:
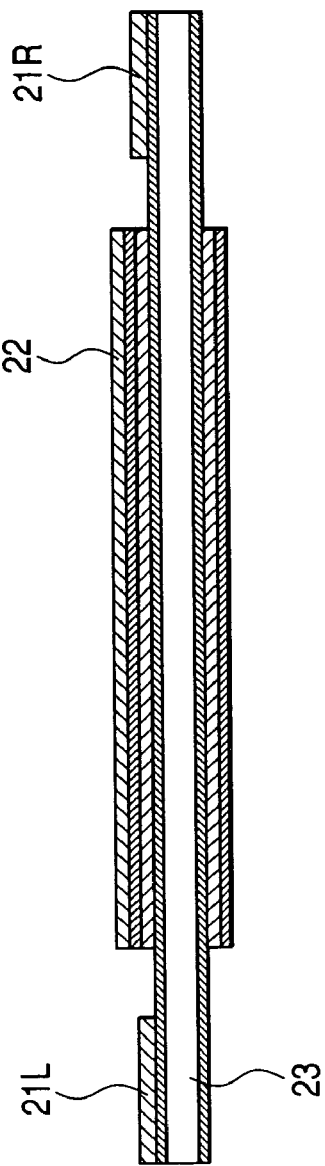
FIG. 10 is a cross-sectional view showing the structure of a capacitor device according to another embodiment.

In the capacitor device 20 shown in FIG. 2, the first electrodes 21 and the second electrodes 22 are formed on both sides (upper and lower surfaces) of the planar base metal 23. Only the upper side is connected to the via holes 41A. As shown in FIG. 10, the electrodes 21 and 22 may be formed on one side of the capacitor device.

According to the embodiment shown in FIG. 1, the via holes are connected to the first electrodes 21L and 21R. The via holes may be connected to either one of them when no high frequency characteristic is required.

As shown in FIG. 1, the via holes 41A of the buildup layer 40A are filled by electrolytic copper plating and conductive paste so that their surfaces are flat. No voids are caused in solder used for connection of the surface-mounted parts. The reliability of the connection of the surface-mounted parts to the printed circuit board is higher.

Referring to FIGS. 3 to 9, a printed circuit board manufacturing method according to this embodiment will be described. The drawings show the respective process states.

In FIG. 3, a printed circuit board (referred to as the core substrate 30) as a core layer is formed. Any material of the core layer used for the printed circuit board may be used.

Figure 4:
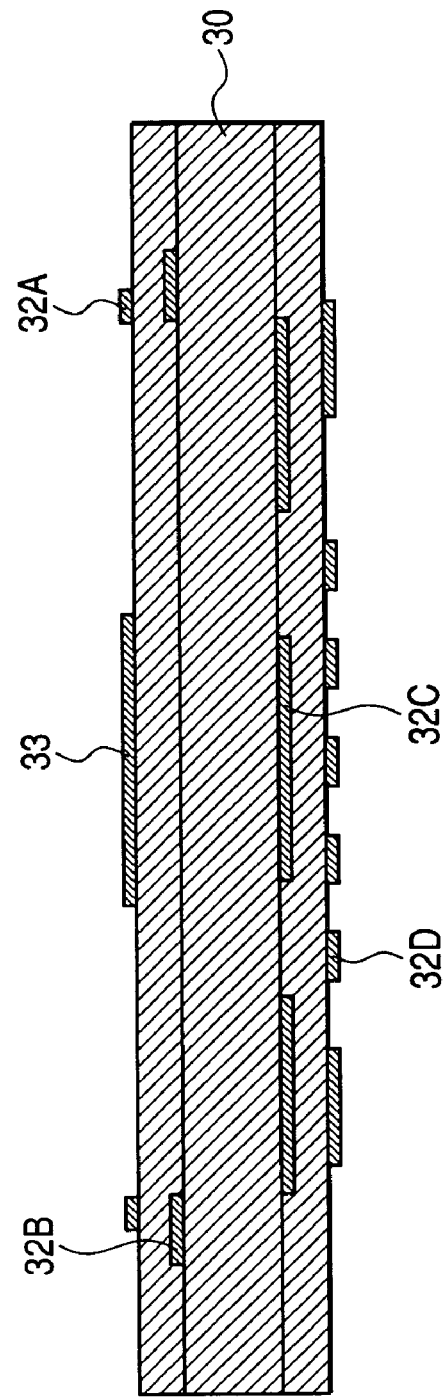
FIG. 4 is a diagram showing a printed circuit board manufacturing process according to an embodiment.

In FIG. 4, the conductor circuits 32A and 32D are formed on the surfaces of the core layer 30. A conductor 33 is formed in a recessing reference plane measuring part in the nearly center of the recessed part for the surface recessed for housing the unpackaged capacitor device. This enables processing of the recess part with high accuracy. According to this embodiment, the conductor circuits are formed by the subtractive method. They may also be formed by other known methods.

Figure 5:
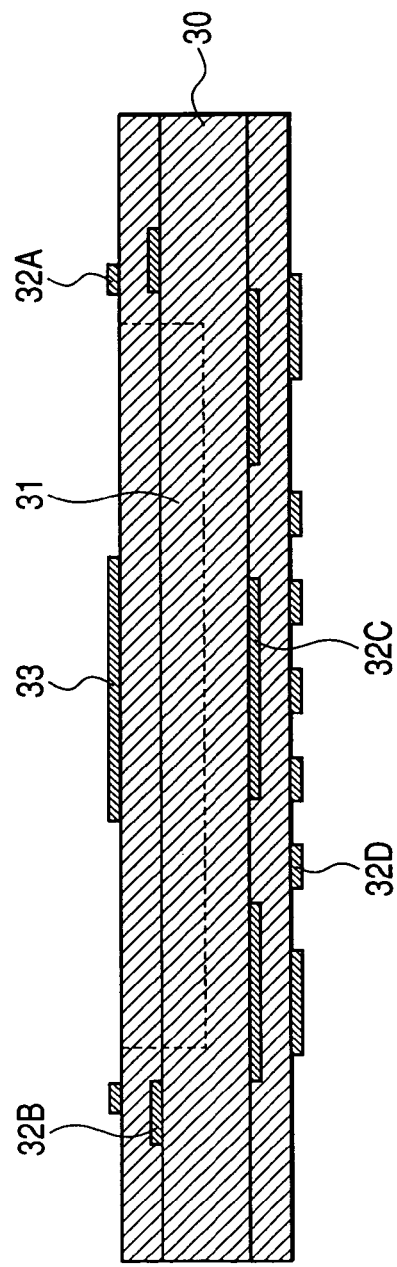
FIG. 5 is a diagram showing a printed circuit board manufacturing process according to an embodiment.

In FIG. 5, after making reference plane measurement of the recessing in the conductor 33, counter boring is performed corresponding to the thickness and size of the unpackaged capacitor device. As indicated by the dotted line of FIG. 5, the recess part 31 housing the capacitor device having a outer dimension of the capacitor device of +200 μm or less and a depth of +50 μm or less is formed on the core layer 30.

Figure 6:
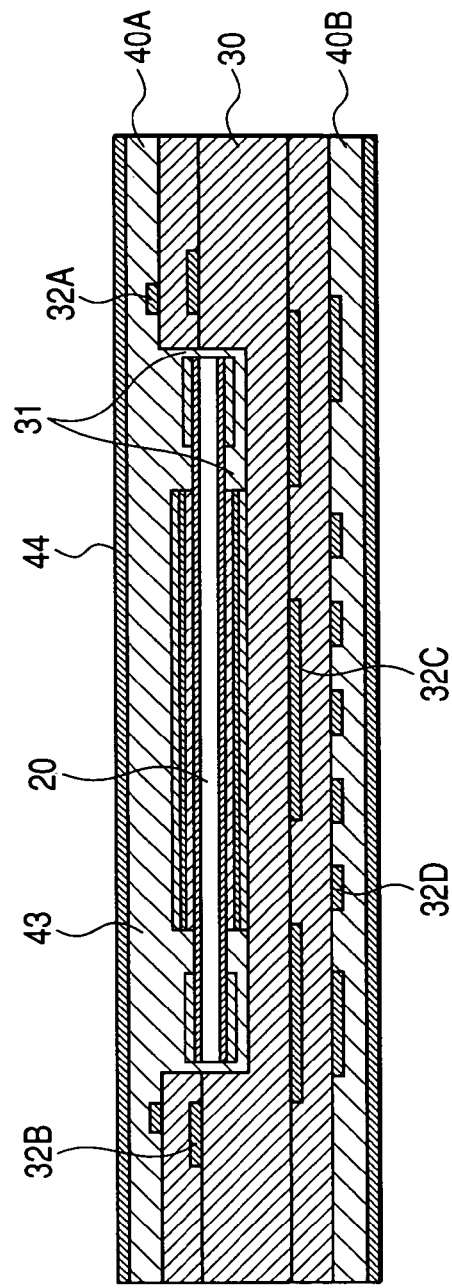
FIG. 6 is a diagram showing a printed circuit board manufacturing process according to an embodiment.

In FIG. 6, after arranging the capacitor device 20 in the recess part 31, sheet-like interlayer insulator resin 43 and copper foil 44 are stacked on both sides of the core layer. The interlayer insulator resin 43 softened by press heating is filled in the recess part 31 by vacuum pressurization. The surface of the stacked printed circuit board is flattened. According to this embodiment, although the interlayer insulator resin 43 without any metal layers is stacked, resin copper foil can be also used.

In FIG. 7, a $CO_2$ laser is used to hole the via holes 41A having a diameter of 0.08 to 0.15 mm reaching the first electrodes 21L and 21R and the second electrode 22 of the capacitor device 20 and the conductor circuits 32A and 32D of the surfaces of the core layer in the buildup layers 40A and 40B. A drill is used to hole a through hole 45 having a diameter of 0.15 to 1.0 for the through hole in the core substrate 30 and the buildup layers 40A and 40B.

In FIG. 8, desmearing is performed to remove any laser beam machined residue on the first electrodes 21L and 21R and the second electrode 22 of the capacitor device 20 and the conductor circuits 32A and 32D on the surfaces of the core layer exposed by the $CO_2$ laser beam machining. Electroless copper plating and electric copper plating are performed to form a copper film 50 having a thickness of 20 to 30 μm.

According to this embodiment, a plating solution for via filling is used for electric copper plating to flatten the surfaces of the via holes by electric copper plating. Resin filling is performed after the electric plating to flatten the surfaces of the via holes. In this case, the filled resin is exposed on the via holes. When performing soldered connection, the electric copper plating needs to be performed again after the resin filling.

Figure 9:
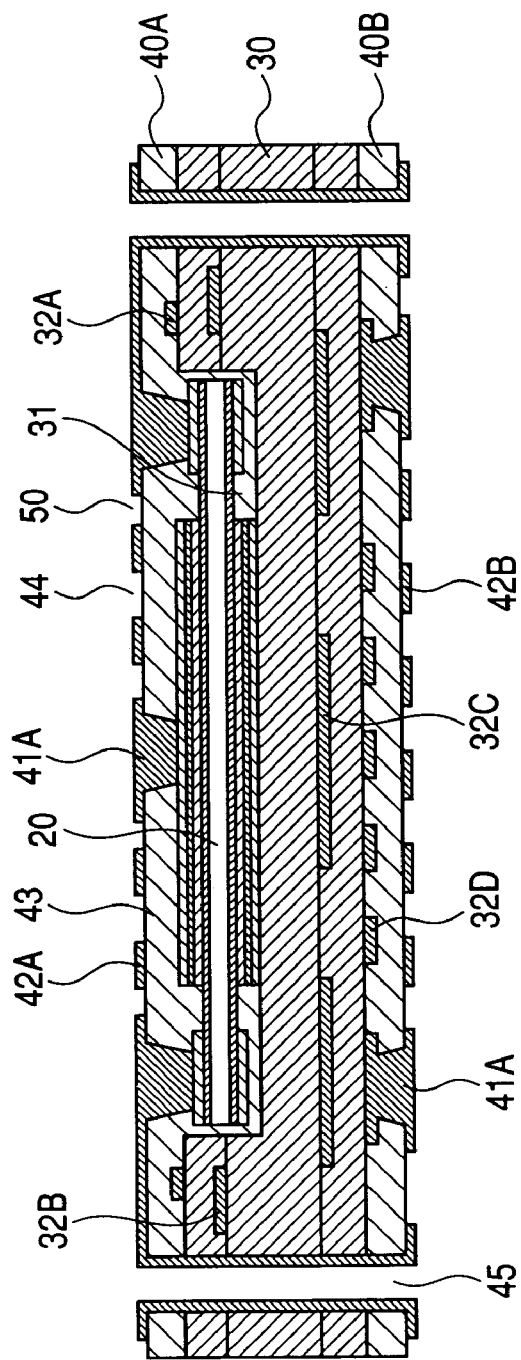
FIG. 9 is a diagram showing a printed circuit board manufacturing process according to an embodiment.

In FIG. 9, a photosensitive dry film resist is laminated on the surface of the multi-layer plate to place a photo mask for exposure. Then development and etching are performed to form the outer layer conductor circuits 42A and 42B for removing any conductor such as copper foil of the unnecessary portion.

As described above, a printed circuit board incorporating a capacitor function can be fabricated. It is possible to prevent the increased number of leads of mounted parts, an IC with a small pitch, fine patterning due to a growing number of parts, increased wiring resistance with a higher multi-layer printed circuit board, and signal delay due to cross talk noise, heat generation, malfunction, and lack in the surface-mounted area. The surfaces of the via holes connected to the surface of the printed circuit board are flat. Therefore high-reliability connection to the surface-mounted parts is enabled.

The unmolded and unpackaged capacitor device having a thickness of 300 μm or less is used as the capacitor part to be buried, so the printed circuit board can be thinner. The large-capacitance capacitor can be incorporated, allowing the number of parts to be reduced.

The electrode portions of the unpackaged capacitor device to be buried are subject to copper plating having a thickness of 10 to 30 μm in which surface roughness is optimized for bonding to the resin. The difference in thickness between the anode portion and the cathode portion is 50 μm or less. The via hole formation is easy and stable. Accordingly high-reliability connection is enabled, and the contact of the unpackaged capacitor device to be buried to the insulator resin is high.

What is claimed is:

1. A printed circuit board that has a core substrate and buildup layers formed on the core substrate, wherein a planar capacitor device that is not resin molded and is formed with anode and cathode electrodes on a shared side is buried into a recess part formed on the core substrate and via holes are formed in said buildup layers to form electric connection to the electrodes.

2. The printed circuit board according to claim 1, wherein the planar capacitor device having a thickness of 300 μm or less is buried.

3. The printed circuit board according to claim 1, wherein the planar capacitor device in which the anode and the cathode have a planar structure is buried.

4. The printed circuit board according to claim 1, wherein the planar capacitor device in which the anode and the cathode are subject to copper plating having a thickness of 10 to 30 μm and the difference in thickness between the anode and the cathode is 50 μm or less is buried.

5. The printed circuit board according to claim 1, wherein the planar capacitor device formed with dielectric layers, the anode electrode, and the cathode electrode via conductive films on the surfaces on both sides of the core substrate is buried.

6. The printed circuit board according to claim 1, further comprising a conductor circuit pattern conducted to the electrodes via the via holes on the surface of the printed circuit board.

7. A capacitor device not resin molded comprising a planar metal substrate, a dielectric layer formed on the substrate, an anode electrode formed on the dielectric layer, and a cathode electrode formed via a conductive film over the dielectric layer, wherein the anode and the cathode are subject to copper plating having a thickness of 10 to 30 μm, and wherein the anode electrode and the cathode electrode are formed on the planar surfaces on a shared side.

8. The capacitor device according to claim 7, wherein the difference in thickness between the anode and the cathode is 50 μm or less.

9. The capacitor device according to claim 7, wherein dielectric layers, the anode electrode, and the cathode electrode via conductive films are formed on the surfaces on both sides of the planar substrate.

* * * * *